(12) United States Patent
Hu et al.

(10) Patent No.: US 10,607,805 B2
(45) Date of Patent: Mar. 31, 2020

(54) FILAMENT POSITIONING SYSTEM AND FILAMENT POSITIONING METHOD

(71) Applicant: NATIONAL CENTER FOR NANOSCIENCE AND TECHNOLOGY, CHINA, Beijing (CN)

(72) Inventors: Xixue Hu, Beijing (CN); Hongbo Guo, Beijing (CN); Dongliang Wang, Beijing (CN); Yaling Gan, Beijing (CN); Xiaohui Xu, Beijing (CN)

(73) Assignee: NATIONAL CENTER FOR NANOSCIENCE AND TECHNOLOGY, CHINA (CN)

( * ) Notice: Subject to any disclaimer, the term of this patent is extended or adjusted under 35 U.S.C. 154(b) by 0 days.

(21) Appl. No.: 15/834,152

(22) Filed: Dec. 7, 2017

(65) Prior Publication Data
US 2019/0074156 A1 Mar. 7, 2019

(30) Foreign Application Priority Data

Sep. 4, 2017 (CN) .......................... 2017 1 0785357

(51) Int. Cl.
*H04N 9/47* (2006.01)
*H04N 7/18* (2006.01)
(Continued)

(52) U.S. Cl.
CPC .............. *H01J 37/067* (2013.01); *G06T 7/73* (2017.01); *H01J 37/244* (2013.01)

(58) Field of Classification Search
CPC .......... H01J 37/067; H01J 37/244; G06T 7/73
See application file for complete search history.

(56) References Cited

U.S. PATENT DOCUMENTS

| 4,922,098 A | * | 5/1990 | Mori ...................... H01J 37/224 250/311 |
| 6,064,468 A | * | 5/2000 | Sakaguchi ........... G03B 27/545 355/35 |

(Continued)

FOREIGN PATENT DOCUMENTS

| CN | 204204789 U | * | 3/2015 |
| CN | 104882348 |   | 9/2015 |

(Continued)

*Primary Examiner* — Fabio S Lima
(74) *Attorney, Agent, or Firm* — McDonald Hopkins LLC

(57) ABSTRACT

Disclosed are a filament positioning system and a filament positioning method. The filament positioning system includes a bottom plate, a first positioning regulating mechanism and a second positioning regulating mechanism, wherein the first positioning regulating mechanism is configured to conduct positioning regulation of a position of a filament seat on the bottom plate, so that filament seats of different models can be fixed to the bottom plate, and the second positioning regulating mechanism is configured to conduct positioning regulation on the filament; and a detection module configured to collect and display position information of a filament tip and the filament seat, wherein the first positioning regulating mechanism and the second positioning regulating mechanism correspondingly regulate positions of the filament seat and the filament tip according to the position information.

19 Claims, 2 Drawing Sheets

(51) Int. Cl.
*H01J 37/067* (2006.01)
*G06T 7/73* (2017.01)
*H01J 37/244* (2006.01)

(56) References Cited

U.S. PATENT DOCUMENTS

| | | | | |
|---|---|---|---|---|
| 7,305,319 B2 * | 12/2007 | Vicci | ............. | G01Q 10/06 |
| | | | | 702/152 |
| 8,785,879 B1 * | 7/2014 | Frosien | ............. | H01J 37/145 |
| | | | | 250/307 |
| 2006/0275347 A1 * | 12/2006 | Evers Smith | ............. | D01F 6/14 |
| | | | | 424/443 |
| 2011/0147609 A1 * | 6/2011 | Shichi | ............. | H01J 27/26 |
| | | | | 250/400 |
| 2012/0217391 A1 * | 8/2012 | Shichi | ............. | H01J 27/26 |
| | | | | 250/306 |
| 2013/0320210 A1 * | 12/2013 | Yamada | ............. | H01J 37/1471 |
| | | | | 250/307 |
| 2017/0323764 A1 * | 11/2017 | Muto | ............. | H01J 27/26 |

FOREIGN PATENT DOCUMENTS

| | | | | | |
|---|---|---|---|---|---|
| JP | 56078052 | A | * | 6/1981 | ............. H01J 37/15 |
| JP | S5678052 | | | 6/1981 | |
| JP | 2650508 | B2 | * | 9/1997 | |

* cited by examiner

FILAMENT POSITIONING SYSTEM AND FILAMENT POSITIONING METHOD

TECHNICAL FIELD

The present disclosure relates to the fields of mechanical engineering and automation, and particularly relates to a filament positioning system and a filament positioning method.

BACKGROUND

An electron microscope as a powerful tool for microscopic appearance observation is applied to the fields of metallurgy, mineral, chemical industry, medicine, biology, biomedicine, food, nano material and the like more and more rapidly and widely. The electron microscope mainly includes a transmission electron microscopy and a scanning electron microscope. The transmission electron microscopy (TEM) uses a focused electron beam as an illumination source, and adopts a film sample transparent to the electron beam to analyze a microstructure in the sample by an image formed by a transmission electron beam or diffraction electron beam penetrating through the sample. The scanning electron microscope uses a high energy electron beam reflected by secondary electrons to scan the sample so as to excite all kinds of physical information. Observation for two-dimensional structure and morphology on a surface of a testing sample is obtained through reception, amplification and image display of the information.

An entire electron optical part of the microscope is completely arranged in a microscope tube, and an electron gun, a collecting lens, an objective lens, an intermediate lens, a projection lens, an observation room, a fluorescent screen, a charge coupled device (CCD) and the like are arranged sequentially from top to bottom, wherein an illumination system composed of the electron gun, the collecting lens and the like provides a beam of light source with high brightness and good coherence for an imaging system. The electron gun is composed of a cathode, a control electrode (gate) and an anode. Electrons emitted by the cathode after heated at high pressure in vacuum obtain high kinetic energy to form a directional high-speed electron flow (electron beam). In a certain range, the larger the current of a filament is, the higher the temperature of the filament is, the more the emitted electrons is, and the faster the evaporation of the surface of the filament is. Thus, the filament has certain life. For example, a tungsten filament has a life of 100-150 hours generally, a lanthanum hexaboride filament has a life more than 1000 hours and a cerium hexaboride filament has a life of about 1500 hours. The filaments need to be replaced frequently.

When the filament of the electron microscope is replaced, a position of the filament is also defined very strictly: a filament tip is required to be located in a center position of the electron gun. If the position of the filament is offset, it is easy to that the brightness of the filament is dark, and operators need to enhance the brightness by increasing the bias or current, thereby damaging the filament. At present, the filament is replaced by means of hands completely, so that not only a large amount of time of instrument managers is wasted, but also manual vision disparity may cause the bias of an installation position of the filament during regulation since the filament tip and a center of a grid cap hole are not in a same plane, influencing use quality of microscopic imaging to different degrees. Meanwhile, due to a difference of manufacturers and a difference of filament types, different filaments of the electron microscope have different filament positioning seats and filament bases. When different types of filaments are positioned, different fixed installation modules need to be adopted for installing and regulating the filaments, causing time and labor consumption, low efficiency, and difficulty in ensuring positioning precision while causing resource waste.

SUMMARY

The present disclosure provides a filament positioning system and a filament positioning method, so as to realize precise and efficient positioning of different kinds of electron microscope filaments.

To achieve the above purpose, the present disclosure adopts the following technical solution:

A filament positioning system includes a bottom plate, a first positioning regulating mechanism and a second positioning regulating mechanism, wherein the bottom plate is provided with a filament seat for fixing a filament; and the first positioning regulating mechanism is installed on the bottom plate, for regulating a position of the filament seat on the bottom plate.

the filament seat has a first positioning center; and the second positioning regulating mechanism is configured to regulate the filament, so that the filament is located in the first positioning center; and a detection module configured to collect and display position information of a filament tip of the filament and the filament seat, wherein the first positioning regulating mechanism and the second positioning regulating mechanism correspondingly regulate positions of the filament seat and the filament according to the position information.

Through the first positioning regulating mechanism, the filament positioning system provided by the present disclosure is applicable to positioning of different types of electron microscope filaments, thereby avoiding a trouble of reconfiguring a filament fixing apparatus during positioning of different types of filaments and increasing filament positioning efficiency. Meanwhile, the detection module is configured to detect and display image positions of the filament tip and the filament seat, thereby avoiding a visual error relative to the position of the first positioning center through direct observation of the filament tip by naked eyes in a traditional manual filament positioning process, enhancing filament positioning precision and prolonging filament life. Moreover, manual regulation and instrument detection collaborate so that filament positioning is more convenient, thereby alleviating labor intensity and labor time of instrument managers.

Optionally, the bottom plate has a second positioning center. The first positioning regulating mechanism regulates the filament seat, so that an axis of the filament seat penetrates through the second positioning center. The first positioning center is located right above the second positioning center. The determination of the second positioning center enables each type of filament seat to have a fixed positioning point, facilitating positioning regulation of an entire system for the filament.

Optionally, the first positioning regulating mechanism includes a plurality of positioning rods. The plurality of positioning rods are radially distributed uniformly by taking the second positioning center as a center. The positioning rods can move along a direction near or away from the second positioning center so that end parts of the positioning rods are abutted against the filament seat to fix the filament seat. The regulating mechanism has simple structure. During regulation, the positioning rods only need to move along the direction near or away from the second positioning center to realize relatively precise positioning and fixing effect.

Optionally, the first positioning regulating mechanism includes a plurality of screw rod and nut components; nuts are fixed to the bottom plate; and screw rods and the nuts are matched to form the positioning rods.

Optionally, the filament seat includes a filament base and a filament positioning seat. The filament positioning seat is installed on the filament base. The filament is installed on the filament positioning seat. Filament positioning seats are different in shapes due to differences in filament models and manufacturers, and are difficult to be directly positioned and installed on the bottom plate, while lower ends of filament bases are cylindrical though the filament bases are different due to the difference in the filament models. Therefore, installation and positioning on the bottom plate are easy to realize.

Optionally, an upper end surface of the filament positioning seat has a grid cap hole. A center of the grid cap hole is the first positioning center. The filament positioning seat is a filament positioning element included in an electron microscope. An electron beam is irradiated on a testing sample through the grid cap hole. By adopting the filament positioning seat for positioning the filament, the positioned filament can be directly installed on the electron microscope, thereby realizing a requirement that the filament tip is located in a central position of an electron gun without a need of re-installation and re-positioning.

Optionally, the second positioning regulating mechanism includes an internal hexagonal wrench configured to regulate a connection screw of the filament and the filament positioning seat to regulate the position of the filament tip. When the connection screw is screwed and fixed, due to a difference in tightening force of each screw, the position of the filament tip is deviated from the right upper part of the first positioning center. By adopting the internal hexagonal wrench to regulate the connection screw, operation is convenient; and the connection screw can be tightened or relaxed through the wrench, thereby regulating the position of the filament tip.

Optionally, the detection module includes an image collection module and an image display module. The image collection module is configured to collect position image information of the filament tip and the filament seat. The image display module is connected with the image collection module for displaying the position image information. The image display module can be combined with the image collection module into a whole, i.e., an image collection apparatus simultaneously has an image display function. The image display module and the image collection module can also be different devices to facilitate further processing for the collected position image information.

Optionally, the image collection module is located right above the second positioning center, thereby reducing position image errors of the filament tip and the filament positioning seat caused by that the collection center of the image collection module is deviated from the second positioning center, enhancing the image collection precision and further enhancing positioning accuracy.

Optionally, the image display module is a computer terminal. The computer terminal receives and processes the position image information. The position image information includes a position image and distance information from the filament tip in the position image to the first positioning center. The computer terminal has stronger information processing capability, can conduct processing and presentation of all modes on the position image information and can realize man-machine interaction more conveniently. The display of the position image is beneficial for observing the filament tip visually relative to the position of the first positioning center by operators, so as to selectively change precision of regulation in each step. The distance information can further avoid the visual error in observation by the naked eyes, so that a system realizes more precise filament positioning.

Optionally, the detection module identifies positions of the filament tip and the first positioning center through a gray scale of the position image, and computes a distance from an orthographic projection of the filament tip on the upper end surface of the filament seat to the first positioning center.

Optionally, the detection module further includes a pressure sensor. The pressure sensor is fixed to an end surface of the positioning rod facing the filament seat, and is connected with the image display module. The image display module displays a detected pressure value. The pressure sensor is configured to detect whether the positioning rod is abutted against the filament seat, and judge an abutting degree of each positioning rod and the filament seat according to the size of the pressure value, thereby reducing an error of a movement distance of each positioning rod possibly caused by regulating the positioning rod, enhancing filament positioning precision and further enhancing filament positioning precision.

Optionally, the filament positioning system further includes a driving component. The driving component is connected with the first positioning regulating mechanism and the second positioning regulating mechanism for driving the first positioning regulating mechanism and/or the second positioning regulating mechanism to perform regulation operation. The introduction of the driving component in the system can reduce a regulation error due to manual regulation of the first positioning regulating mechanism or the second positioning regulating mechanism, enhance the filament positioning precision and also reduce labor intensity of the managers and save filament regulation time of the managers.

Optionally, the driving component includes a first driving component. The first driving component is connected with the first positioning regulating mechanism for driving the first positioning regulating mechanism to operate to regulate an axis position of the filament seat. The driving component for driving the first positioning regulating mechanism is individually arranged, thereby avoiding that the first positioning regulating mechanism and the second positioning regulating mechanism cannot be driven in case of failure of the driving component, and enhancing system reliability.

Optionally, the first driving component includes a first motor or hydraulic cylinder. Two driving apparatuses are common. An additional design for the driving apparatuses is not needed, thereby reducing system cost.

Optionally, the driving component also includes a second driving component. The second driving component is connected with the second positioning regulating mechanism for driving the second positioning regulating mechanism to operate to regulate the position of the filament tip. The driving component for driving the first positioning regulating mechanism and the driving component for driving the second positioning regulating mechanism are individually arranged, thereby avoiding adopting the same driving component to simultaneously drive the first positioning regulating mechanism and the second positioning regulating mechanism and reducing complexity for regulation and control of the system.

Optionally, the second driving component includes a second motor.

Optionally, the second motor is a stepping motor or servo motor. The stepping motor or servo motor can control angular displacement amount by controlling a number of pulses, thereby achieving a purpose of accurate positioning. Meanwhile, rotating speed and acceleration of the motor can be controlled by controlling pulse frequency, thereby achieving a purpose of speed regulation. Furthermore, when a driving signal is lost, stop can be realized in time, which is extremely quick in reaction, thereby ensuring precision for driving regulation and control.

Optionally, a regulation precision of the second motor is less than 100 μm, so as to realize fine regulation for the filament and ensure the filament positioning precision.

Optionally, the filament positioning system further includes a control component. The control component is electrically connected with the detection module and the driving component. The control component receives the position information transmitted by the detection module, and controls the driving component to drive the first positioning regulating mechanism and/or the second positioning regulating mechanism to operate. The introduction of the control component in the system can realize filament positioning automatically in the system, avoid a positioning error possibly caused by manual regulation to a maximum extent, enhance the positioning precision, and simultaneously alleviate the labor intensity of the managers to a large degree and save system management time.

Optionally, the control component includes a controller and a driver. The controller is connected with the computer terminal, receives a regulating command and a regulating parameter issued by the computer terminal, and transmits a signal to the driver. The driver is connected with the driving component and the controller. The driver receives the signal and drives the driving component to move. Accurate control for the motor can be realized by sending a control signal to the driver by the controller: whenever the controller sends a pulse signal, the motor rotates by a stepping angle through the driver. Therefore, the rotating speed of the motor is in direct proportion to frequency of a pulse signal. Precise speed regulation for the motor can be realized by controlling the frequency of a stepping pulse signal. Accurate positioning for the motor can be realized by controlling the number of stepping pulses.

Optionally, the regulating command includes a filament regulating command and/or a filament seat regulating command. The filament regulating command is used for regulating the position of the filament tip relative to the first positioning center. The filament seat regulating command is used for regulating the position of the filament seat relative to the second positioning center and fixing the filament base. Different regulating commands can be issued so that the positioning regulation of the filament seat and the positioning regulation of the filament can be performed in a full automatic mode.

Optionally, the regulating parameter includes a number of axes, a wheelbase, a rotating angle and a number of feed steps of the motor. The parameters can be used for controlling precise regulation of the motor for the filament.

The present disclosure further provides a filament positioning method. Filament positioning is realized through a manual adjustment mode. The method includes the following steps:

installing a filament seat and a filament respectively on a bottom plate and the filament seat;

displaying position information of the filament seat and the filament by a detection module;

manually driving a first positioning regulating mechanism to regulate a position of the filament seat according to the position information so that the filament seat is fixed to the bottom plate; and manually driving a second positioning regulating mechanism to regulate the filament according to the position information so that the filament tip is located in the first positioning center.

The position information provided by the manual filament positioning method provided by the present disclosure by adopting the detection module includes position image information and position distance information, thereby avoiding a visual error caused by directly observing a relative position of the filament tip and a filament positioning seat with naked eyes during traditional manual filament positioning, improving the positioning accuracy of the filament, prolonging the filament life, enabling the filament regulation to be more convenient and fast, reducing labor time and labor intensity required for the filament regulation and also being applicable to the positioning of different types of filaments.

The present disclosure further provides a filament positioning method. The filament positioning is realized through a semi-automatic regulation mode. The method includes the following steps:

installing a filament seat and a filament respectively on a bottom plate and the filament seat;

displaying position information of the filament seat and the filament by a detection module;

manually driving the driving component according to the position information to enable the driving component to drive the first positioning regulating mechanism to regulate the position of the filament seat so that an axis of the filament seat penetrates through the second positioning center; and manually driving the driving component according to the position information to enable the driving component to drive the second positioning regulating mechanism to regulate the filament so that the filament tip is located right above the first positioning center.

The semi-automatic filament positioning method provided by the present disclosure enables the driving component to drive the first positioning regulating mechanism and the second positioning regulating mechanism for performing a regulation action by manually driving the driving component, thereby avoiding an error generated by manually driving the regulating mechanism directly and enabling the filament positioning to be more accurate.

The present disclosure further provides a filament positioning method. The filament position is realized through a full-automatic regulation mode of a system. The method includes the following steps:

installing a filament seat and a filament respectively on a bottom plate and the filament seat;

displaying position information of the filament seat and the filament by a detection module;

computing a regulating parameter and issuing a regulating command by a computer terminal according to the position information;

receiving the regulating command and the regulating parameter by a control component; and driving the driving component to enable the component to drive the first positioning regulating mechanism and the second positioning regulating mechanism to operate so that an axis of the filament seat penetrates through the second positioning center and the filament tip is located in the first positioning center.

The full-automatic filament positioning method provided by the present disclosure controls the first positioning regulating mechanism and the second positioning regulating mechanism through the control component, so that mechanical drive and a detection apparatus generate a synergistic effect, thereby minimizing an influence of a human factor, enabling the filament positioning to be more accurate, also greatly reducing the labor intensity and the labor time of instrument managers for the filament positioning, and increasing the work efficiency of the instrument.

Optionally, the position information includes position image information and distance information of the filament tip and the first positioning center, and distance information of the axis of the filament seat relative to the second positioning center. With the position information, a filament seat positioning process and a filament positioning process can be effectively monitored and fed back in real time, thereby guaranteeing the accuracy of the filament seat positioning and the filament positioning.

The present disclosure has beneficial effects that:

(1) The present disclosure is applicable to positioning of different types of filaments, thereby avoiding a trouble of reconfiguring a filament fixing apparatus during positioning of different types of filaments and increasing filament positioning efficiency.

(2) Images of the filament and the filament seat are detected with the detection module, thereby avoiding a visual error caused by directly observing the filament position with naked eyes, enhancing filament positioning precision, further improving the imaging quality of the electron microscope, and prolonging the filament life.

(3) Damage to vision because the instrument managers directly observe a distance between a tiny filament tip and a center of a grid cap hole by the naked eyes during traditional manual filament positioning is avoided, so that the filament positioning is more convenient and fast, thereby reducing the labor intensity and the labor time of the instrument managers, and increasing the work efficiency of the instrument.

(4) Meanwhile, with the use of the system, a purchasing quantity of centered electron microscope filaments is reduced, thereby greatly saving the operation expense of the electron microscope.

REFERENCE SIGNS

11: Bottom plate; 12: First positioning regulating mechanism; 121: Positioning rod; 13: Second positioning regulating mechanism; 14: Second positioning center;
2: Filament seat; 21: Filament base; 22: Filament positioning seat;
3: Filament;
41: Image detection module; 42: Image display module;
5: Driving component; 51: First driving component; 52: Second driving component;
6: Control component; 61: Driver; 62: Controller.

DETAILED DESCRIPTION

Further detailed description is made to the present disclosure below in combination with drawings and embodiments. Understandably, specific embodiments described herein are only used for explaining the present disclosure, rather than defining the present disclosure. In addition, it should also be noted that, the drawings only illustrate some structures related to the present disclosure, rather than all structures, so as to facilitate the description.

Embodiment I

Figure 1:
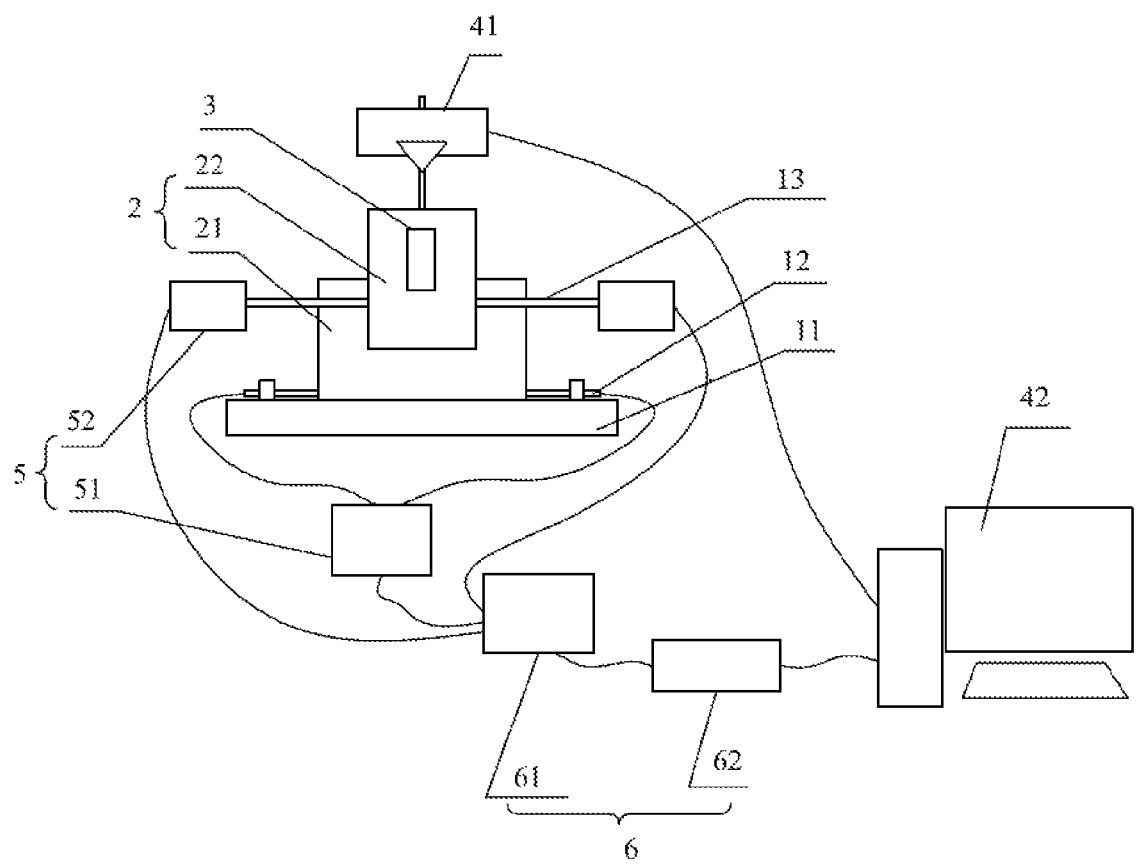
FIG. 1 is a schematic diagram illustrating a filament positioning system provided by the present disclosure.
Figure 2:
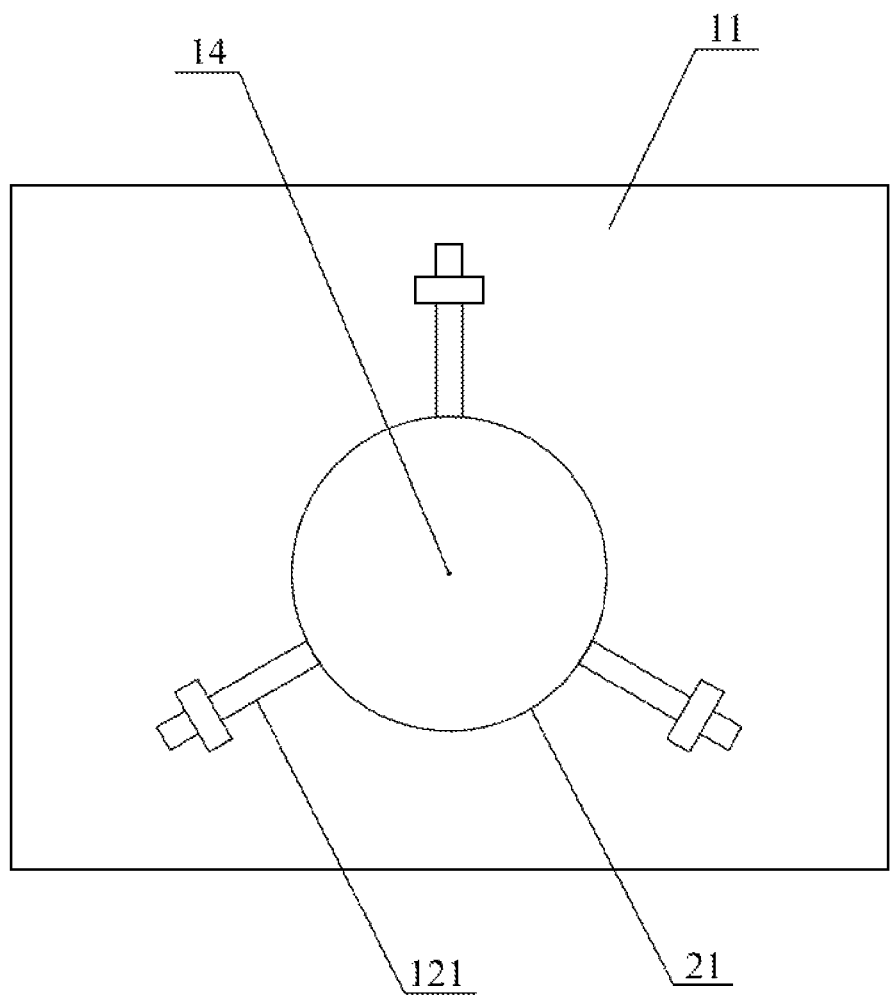
FIG. 2 is a schematic diagram illustrating a first positioning regulating mechanism provided by the present disclosure.

As shown in FIG. 1 and FIG. 2, embodiment I of the present disclosure provides a filament positioning system, including a bottom plate 11, a first positioning regulating mechanism 12, a second positioning regulating mechanism 13, a detection module, a driving component 5 and a control component 6. The bottom plate 11 is configured to fix the first positioning regulating mechanism and a filament seat 2; the first positioning regulating mechanism 12 is configured to position and fix different types of filament seats 2, and the second regulating mechanism 13 is configured to position and regulate different types of filaments 3, so that the filament positioning system is applicable to positioning of different types of filaments 3; the detection module is configured to detect parameters required for regulating the filaments 3 and the filament seats 2; the driving component 5 is configured to drive the first positioning regulating mechanism 12 and the second positioning regulating mechanism 13 for making a regulation action; and the control component 6 is configured to control action execution of the driving component 5.

Specifically, the bottom plate 11 has a second positioning center 14. The first positioning regulating mechanism 12 is installed on the bottom plate 11. The first positioning regulating mechanism 12 includes a plurality of positioning rods 121, and the plurality of positioning rods 121 are radially distributed uniformly by taking the second positioning center 14 as a center. The positioning rods 121 are connected to the bottom plate 11, and can move along a direction near or away from the second positioning center 14 so that the first positioning regulating mechanism 12 is regulated according to different types of filaments seats 2, and a center axis of each filament seat 2 passes through the second positioning center 14 and is abutted against the filament seat 2 through end parts of the positioning rods 121 so as to fix the filament seat 2.

Movement of the positioning rods 121 can be achieved through various types of transmission mechanisms. For example, the first positioning regulating mechanism 12 can be a plurality of screw rod and nut components, nuts are fixed to the bottom plate 11, and screw rods and the nuts are matched to form the positioning rods 121. When the screw rods are rotated forwardly or reversely, the positioning rods 121 can be driven to make a reciprocating motion, thereby regulating a position of the filament seat 2 and fixing the filament seat 2. The first positioning regulating mechanism 12 can also be other structures which can realize the above regulating positioning function. For example, the movement of the positioning rods 121 can be realized through a cylinder, a hydraulic cylinder and the like, and the quantity of the positioning rods 121 is at least three, so as to enable the positioning to be more accurate.

The filament seat 2 includes a filament base 21 and a filament positioning seat 22. The filament base 21 is installed on the bottom plate 11, and an axis of the filament base 21 penetrates through the second positioning center 14. The filament positioning seat 22 is installed on the filament base 21, and the filament 3 is installed on the filament positioning seat 22 through at least one connection screw. The filament positioning seat 22 and the filament base 21 are a positioning element and a fixing element of the filament 3 matched with the selected filament 3; the filament positioning seat 22 is a positioning element of the filament 3 included in an electron microscope; an upper end surface of the filament positioning seat 22 has a grid cap hole; a center of the grid cap hole is a first positioning center; and an electron beam emitted by an electron gun is irradiated on a testing sample through the grid cap hole. Therefore, a purpose of regulating the filament 3 is to locate the filament tip of the filament 3 in a central position of the electron gun, that is, to make the filament tip located in the first positioning center.

The second positioning regulating mechanism 13 is configured to regulate the filament 3 to realize the positioning of the filament 3. The second positioning regulating mechanism 13 includes an internal hexagonal wrench configured to regulate a connection screw of the filament 3 and the filament positioning seat 22, and regulate and fix the position of the filament tip by tightening or relaxing the connection screw, thereby achieving the purpose of positioning the filament 3.

The detection module is configured to collect and display position information of the filament tip and the filament seat 2. The detection module includes an image collection module 41 and an image display module 42. The image collection module 41 is located right above the second positioning center 14 and is configured to collect position image information of the filament tip and the filament seat 2; and the image display module 42 is connected with the image collection module 41 and is configured to display the position image information.

When replacing the filament 3, since the types and manufacturers of the filaments 3 used by the electron microscope are different, the electron microscope filament 3 has different shapes, and the filament positioning seat 22 and the filament base 21 matched with the filaments 3 are also different. For example, different filament bases 21 have different bottom diameters. The first positioning regulating mechanism 12 can regulate and position the filament base 21 with different diameters, and thus, the filament positioning system in the present disclosure is applicable to different types of electron microscope filaments 3. Since the image collection module 41 is arranged right above the second positioning center 14, and an axis of the filament base 21 penetrates through the second positioning center 14, the filament 3 and the filament positioning seat 22 are located in a detection center of an image detection module, thereby reducing a detection error of the image collection module 41 to a relative position of the filament tip of the filament 3 and the first positioning center, improving the positioning accuracy, avoiding a trouble of reconfiguring a fixing apparatus of the filament base 21 and regulating the detection center again due to differences of shapes of the replaced filaments 3, and reducing a positioning error caused by that the traditional filament base 21 has no fixed positioning center. Meanwhile, the arrangement of the image display module 42 can display a relative position image of the filament 3 and the filament positioning seat 22 in a clear and amplified manner and display distance information of the filament and the first positioning center, so that the system avoids the visual error caused by observing the position of the filament tip only by naked eyes during a regulating process of a traditional filament 3 when positioning regulating is performed on the filament 3 manually, thereby improving the positioning accuracy of manually regulating the filament 3.

The driving component 5 is configured to drive the first positioning regulating mechanism 12 and/or the second positioning regulating mechanism 13 for regulating work, and includes a first driving component 51 and a second driving component 52. The first driving component 51 is connected with the first positioning regulating mechanism 12, and is configured to drive the first positioning regulating mechanism 12 to regulate an axis position of the filament seat 2. The first driving component 51 may include a first motor or a hydraulic cylinder. The second driving component 52 is connected with the second regulating mechanism through a coupling, a bayonet, welding or bonding and other ways, and is configured to drive the second regulating mechanism for the regulating work so as to regulate the position of the filament tip. The second driving component 52 may include a second motor which is a stepping motor or a servo motor so as to realize accurate control of motor rotation, and then, realize the accurate positioning of regulation to the filament 3. Since an error of the filament tip and the first positioning center is relatively small, the regulation precision of the second motor is less than 100 μm, such as, 0.01 μm, 0.1 μm, 0.2 μm, 0.5 μm, 0.6 μm, 0.8 μm, 1 μm, 2 μm, 5 μm, 10 μm, 12 μm, 15 μm, 20 μm, 30 μm, 40 μm, 50 μm, 60 μm, 70 μm, 80 μm, 90 μm or 100 μm, so as to improve the positioning regulating precision of the filament 3. To enable the system to uniformly control the driving component 5, the first driving component 51 and the second driving component 52 are stepping motors so as to realize the accurate control and positioning of the filament 3 and the filament seat 2, and improve the positioning accuracy of the filament seat 2 and the filament 3.

Arrangement of the driving component 5 can enable the system to realize the positioning regulating of the filament 3 and the filament seat 2 in a semi-automatic mode. For example, when regulating the filament 3, stepping of the second motor can be manually regulated by observing the position image information and distance information displayed by the image display module 42, so that the second motor drives the second positioning regulating mechanism 13 to regulate the screw, until the filament tip in the image coincides with the first positioning center. When the positioning regulation is performed on the filament seat 2, the first motor is manually driven so that the first motor drives the first positioning regulating mechanism 12 for the regulating work, and the first positioning regulating mechanism 12 realizes simultaneous movement of a plurality of positioning rods 121, until the ends of the plurality of positioning rods 121 are abutted against the filament base 21, namely, the positioning of the filament base 21 is realized. Through the realization of a semi-automatic positioning method of the filament 3 and filament seat 2, a workload of manual regulation can be alleviated, the regulation time is reduced, and meanwhile, the positioning accuracy of the filament 3 is improved.

The image display module 42 can be a computer terminal. The computer terminal is connected with the image collection module 41, receives the position image information of the filament 3 and the filament positioning seat 22, and detects and processes the position image information. Namely, the computer terminal transforms the position image information into a form which can be recognized by the computer, and then, carries out the position image recognition and calculation of a regulating parameter. The position image recognition refers to recognizing positions of the filament tip and the first positioning center on the image through an image grayscale, then calculating a distance between the filament tip and the first positioning center, transforming the above distance into an actual drive distance with a calibration method, and further calculating the regulating parameter of the filament 3. The calibration method is a common method in the field, and is not repeated again. The regulating parameter includes a number of axes, a wheelbase, a rotating angle and a number of feed steps of the motor. The number of feed steps of the motor is obtained by dividing the actual drive distance by a step length of the first motor. In a positioning regulating process of the filament 3, stepping of the first motor can be manually adjusted according to the calculated regulating parameter, thereby realizing the semi-automatic positioning of the filament 3.

The computer terminal can also issue a regulating command, and the position image detection and processing, the position image recognition and the regulating command issuing by the computer terminal are performed through integrated control software. The integrated control software includes software for position image detection and processing of the filament 3, software for position image recognition of the filament 3, software for position regulating command issuing of the filament 3 and software for regulating command issuing of the filament seat 2.

The detection module further includes a sensor component fixed on an end surface of the positioning rods 121 facing the filament seat 2 and the internal hexagonal wrenches of the second positioning regulating mechanism 13, and is configured to detect whether each of the positioning rods 121 is abutted against the filament seat 2. The sensor component is connected with the computer terminal and transmits a detection signal to the computer terminal in real time. The computer terminal receives the detection signal and displays a measured value. The sensor component can be a distance sensor, a pressure sensor and the like, and may be the pressure sensor. The pressure sensor generates a pressure value only when the positioning rods 121 are abutted against the filament seat 2, so that the control is relatively convenient.

The control component 6 includes a controller 62 and a driver 61. Since the motor cannot be directly connected to a DC or AC power supply to operate, a special driving power must be used, i.e., a stepping motor driver 61. The controller 62 is connected with the driver 61 and the terminal, receives the regulating command and the regulating parameter issued by the computer terminal, and transmits a signal to the driver 61. The driver 61 is connected with the first motor and the second motor, and receives the signal sent by the controller 62 and drives the first motor or the second motor to operate. The controller 62 enables the motor to rotate by a step angle through the driver 61 whenever transmitting a pulse signal. Therefore, a rotating speed of the motor is in direct proportion to a frequency of the pulse signal, and thus, the precise speed regulation can be carried out on the motor by controlling the frequency of a stepping pulse signal; and the accurate positioning of the motor can be realized by controlling number of the stepping pulses.

The control component 6 can enable the system to realize the full-automatic regulation for the filament seat 2 and the filament 3. When regulating the filament seat 2, the computer terminal receives detection information transmitted by the sensor component, namely, pressure values of a plurality of pressure sensors. When at least one pressure value is less than a predetermined value, the computer terminal transmits the regulating command of the filament seat 2; the controller 62 receives the command and transmits the pulse signal to the driver 61; the driver 61 receives the signal and drives the first motor to rotate; and the first motor drives the first positioning regulating mechanism 12, enables a plurality of positioning rods 121 to simultaneously move to a direction near the second positioning center 14, and can control a movement distance of each positioning rod 121, so that the axis of the filament seat 2 penetrates through the second positioning center 14; and a positioning regulating action of the filament seat 2 is completed, i.e., the positioning fixing of the filament seat 2 is realized, until the pressure values of all pressure sensors are not less than the predetermined value. When regulating the filament 3, the image collection module 41 collects the position image information of the filament 3 and the filament positioning seat 22 and transmits the position image information to the computer terminal; the computer terminal receives the position image information and carries out the position image information detection and processing, the image position recognition of the filament 3 and the regulating command issuing of the filament 3; the controller 62 receives the regulating command and the regulating parameter, and transmits the signal to the driver 61; the drive 61 receives the signal and drives the second motor to operate; and the second motor drives a second positioning regulating apparatus for the regulating work, and finally, enables the filament tip of the filament 3 to be located in the first positioning center, thereby completing the positioning of the filament 3.

Embodiment II

Embodiment II of the present disclosure provides a filament positioning method. The positioning of the filament 3 is realized through manual regulation. The method includes the following steps.

In step 1, a filament seat 2 and a filament 3 are respectively installed on a bottom plate 11 and the filament seat 2;

For a selected to-be-replaced filament 3, an appropriate filament seat 2 is selected according to a type of the filament 3. The filament seat 2 includes a filament positioning seat 22 and filament base 21 included in an electron microscope. The filament 3 is installed on the filament positioning seat 22 through four connection screws. The filament positioning seat 22 is installed on the filament seat 21. The filament base 21 is placed on the bottom plate 11.

In step 2, a detection module displays position information of the filament seat 2 and the filament 3;

The detection module may include an image collection module 41, an image display module 42 and a pressure sensor. The image collection module 41 is configured to collect position image information of the filament seat 2 and the filament 3. The image display module 42 is configured to display the position image information. When the image display module 42 is a computer terminal, the computer terminal can also calculate distance information of a filament tip and a first positioning center on an image. The pressure sensor is configured to detect an abutting relationship between the positioning rods 121 and the filament seat 2, and transmit a detected pressure value to the computer terminal for displaying. Therefore, the above position information includes a position image of the filament tip and the filament seat 2, an actual distance of the filament tip and the first positioning center on the same frontal projection plane and distance information of an axis of the filament seat 2 relative to a second positioning center 14, i.e. a pressure value of each pressure sensor.

In step 3, a first positioning regulating mechanism 12 is manually driven to adjust a position of the filament seat 2 according to the position information.

According to the pressure value of each pressure sensor in the position information, each positioning rod 121 is manually driven alternately to move to a direction near a second positioning center 14. In a manual drive process, a change of each pressure value is observed in real time. When each pressure value is greater than a predetermined value, it indicates that each positioning rod 121 is abutted against the filament seat 2. When all pressure values are the same, it indicates that each positioning rod 121 has a same abutting state as that of the filament seat 2, namely, an axis of the filament seat 2 penetrates through a position of the second positioning center 14, thereby completing the positioning regulating of the filament 2.

In step 4, a second positioning regulating mechanism 13 is manually driven to regulate the filament 3 according to the position information, so that the filament tip is located in the first positioning center.

According to a position image of the filament tip and the filament seat 2 in the position information and an actual distance of the filament tip and the first positioning center on the same frontal projection plane, connection screws are manually regulated alternately, and a position of the filament tip is regulated by tightening and relaxing the connection screws, so that the filament tip is located in the first positioning center.

The manual filament positioning method provided by embodiment II avoids a visual error caused by directly observing a relative position of the filament tip and the filament positioning seat 22 by naked eyes during traditional manual positioning of the filament 3, thereby improving the positioning accuracy of the filament 3. Meanwhile, the filament 3 can be applicable to positioning of different types of filaments 3.

Embodiment III

Embodiment III of the present disclosure provides a filament positioning method. The positioning of a filament 3 is realized in a semi-automatic mode, and steps are roughly the same as those of embodiment II. A difference from embodiment II is that, in step 3 and step 4, a first positioning regulating mechanism and/or a second positioning regulating mechanism is driven through a driving component to operate, specifically as follows.

In step 3, The driving component 5 is manually driven, so that the driving component 5 drives a first positioning regulating mechanism 12 to regulate a position of the filament seat 2 and an axis of the filament seat 2 penetrates through the second positioning center 14.

According to a pressure value of each pressure sensor in position information, a first driving component 51 is manually driven. Specifically, a first motor is driven, so that the first motor drives each positioning rod 121 to move simultaneously. When each pressure value is greater than a predetermined value, driving to the first motor is stopped, thereby realizing the positioning and fixing of the filament seat 2; and the axis of the filament seat 2 penetrates through the second positioning center 14.

In step 4, the driving component 5 is manually driven according to the position information, so that the driving component 5 drives the second positioning regulating mechanism 13 to regulate the filament 3 and the filament tip is located in the first positioning center.

According to a position image of the filament tip and the filament seat 2 in the position information and an actual distance of the filament tip and the first positioning center on the same frontal projection plane, a second motor is manually driven, so that the second motor drives a second positioning regulating mechanism 13 to carry out positioning regulating on the filament 3. Or according to the actual distance between the filament tip and the first positioning center, a computer terminal calculates an actual drive distance of the second motor, acquires a stepping number of the second motor, and manually regulates stepping of the second motor according to the calculated stepping number, so that the second motor drives the second positioning regulating mechanism 13 to carry out positioning regulating on the filament 3, and the filament tip of the filament 3 is located in the first positioning center.

The semi-automatic filament positioning method provided by the present embodiment III avoids an error caused by manually driving the regulating mechanism, so that the positioning of the filament 3 is more accurate, and meanwhile, the workload of managers is reduced.

Embodiment IV

Embodiment IV provides a full-automatic filament positioning method. Step 1 and step 2 are the same as those of embodiment II, and a difference from embodiment II is that, a subsequent step of step 2 is to control movement of the driving component through a control component, so as to drive the first regulating machine 12 and/or the second positioning regulating mechanism 13 to operate, specifically as follows.

In step 3, a computer terminal calculates a regulating parameter and issues a regulating command according to the position information.

The position information is the same as the position information in embodiment II, and is not repeated again. The computer terminal transforms the above distance into an actual drive distance with a calibration method according to a distance between the filament tip and the first positioning center in the position information, and calculates the regulating parameter for regulating the filament 3. The regulating parameter includes a number of axes, a wheelbase, a rotating angle and a number of feed steps of the first motor, and the number of feed steps of the first motor is obtained by dividing the actual drive distance by a step length of the first motor. The regulating command of the filament 3 is issued according to the calculated regulating parameter. When a pressure value of at least one pressure sensor is lower than a predetermined value, a regulating command of the filament seat 2 is issued according to the pressure value detected by each pressure sensor.

In step 4, A controller component 6 receives the regulating command and the regulating parameter;

A controller 62 receives the regulating command and the regulating parameter issued by the computer terminal, and transmits a signal to the driver 61. The driver 61 selects to transmit a pulse signal to the first motor or transmit a pulse signal to the second motor according to a type of the regulating command, so as to drive the first motor or the second motor.

In step 5, The driver 61 drives the driving component 5, so that the driving component 5 drives the first positioning regulating mechanism 12 and the second positioning regulating mechanism 13 to operate, and the axis of the filament seat 2 penetrates through the second positioning center 14 and the filament tip is located in the first positioning center.

When the regulating command in step 4 is the regulating command of the filament seat 2, the controller 62 drives the first motor; the first motor drives the first positioning regulating mechanism 12 for the regulating work, and drives a plurality of positioning rods 121 to move simultaneously; until the pressure value of each pressure sensor is greater than the predetermined value, the computer terminal does not transmit the regulating command of the filament seat 2, and stops driving the first motor, namely, the positioning of the filament seat 2 is completed, so that the axis of the filament seat 2 penetrates through the second positioning center 14.

When the regulating command in step 4 is the regulating command of the filament 3, the controller 62 drives the second motor, so that the second motor drives the second positioning regulating mechanism 13 for the regulating work according to the regulating parameter, and regulates the filament tip to be located in the first positioning center, namely, the positioning of the filament 3 is completed.

According to the full-automatic filament positioning method provided by embodiment IV of the present disclosure, cooperative operation of the mechanical drive and real-time detection is adopted. Therefore, the system principle is simple, thereby avoiding an influence of a human factor in a positioning regulating process of the filament 3, improving the positioning accuracy of the filament 3, improving the imaging quality, prolonging the life of the filament 3, and enabling the instrument to operate more effectively. Meanwhile, the labor intensity of the instrument managers is reduced, and the time of instrument management is saved. Not only imaging study in scientific research work is facilitated, but also use quality of the filament 3 and the electron microscope is guaranteed, thereby increasing the efficiency of extensive instrument users.

It should be noted that, the above embodiments are embodiments of the present disclosure and technical principle used. Those skilled in the art shall understand that, the present disclosure is not limited to specific embodiments herein. For those skilled in the art, various apparent changes, readjustments and substitutions can be conducted, without departing from a protection scope of the present disclosure. Therefore, although the present disclosure is described in detail through above embodiments, the present disclosure is not limited to above embodiments, and can also include more other equivalent embodiments without departing from the concept of the present disclosure. Moreover, the scope of the present disclosure is determined by a scope of claims attached.

The invention claimed is:

1. A filament positioning system, comprising:
a bottom plate, a first positioning regulating mechanism and a second positioning regulating mechanism,
wherein the bottom plate is provided with a filament seat, configured at a surface of the bottom plate, for fixing a filament and the first positioning regulating mechanism is installed on the bottom plate for regulating a position of the filament seat at the surface of the bottom plate, wherein the position of the filament seat relative to the bottom plate is changeable;
wherein the filament seat has a first positioning center and the second positioning regulating mechanism is configured to regulate the filament, so that a filament tip of the filament is located in the first positioning center,
wherein a detection module is configured to collect and display position information of the filament tip of the filament and the filament seat,
wherein the first positioning regulating mechanism and the second positioning regulating mechanism correspondingly regulate positions of the filament seat and the filament according to the position information
wherein the bottom plate has a second positioning center and the first positioning regulating mechanism regulates the filament seat so that an axis of the filament seat penetrates through the second positioning center, and
wherein the first positioning center is located right above the second positioning center.

2. The filament positioning system according to claim 1, wherein the first positioning regulating mechanism comprises a plurality of positioning rods, wherein the plurality of positioning rods are radially distributed uniformly by taking the second positioning center as a center, and wherein the positioning rods is movable along a direction near or away from the second positioning center so that end parts of the positioning rods are abutted against the filament seat to fix the filament seat.

3. The filament positioning system according to claim 2, wherein the first positioning regulating mechanism comprises a plurality of screw rod and nut components, wherein the nuts are fixed to the bottom plate, and wherein the screw rods and the nuts are matched to form the positioning rods.

4. The filament positioning system according to claim 1, wherein the filament seat comprises a filament base and a filament positioning seat, wherein the filament positioning seat is installed on the filament base, and wherein the filament is installed on the filament positioning seat.

5. The filament positioning system according to claim 4, wherein an upper end surface of the filament positioning seat has a grid cap hole, and wherein a center of the grid cap hole is the first positioning center.

6. The filament positioning system according to claim 5, wherein the second positioning regulating mechanism comprises an internal hexagonal wrench configured to regulate a connection screw of the filament and the filament positioning seat to regulate a position of the filament tip.

7. The filament positioning system according to claim 1, wherein the detection module comprises an image collection module and an image display module, wherein the image collection module is configured to collect position image information of the filament tip and the filament seat, and wherein the image display module is connected with the image collection module for displaying the position image information.

8. The filament positioning system according to claim 7, wherein the image collection module is located right above the second positioning center.

9. The filament positioning system according to claim 7, wherein the image display module is a computer terminal, wherein the computer terminal receives and processes the position image information, and wherein the position image information comprises a position image and distance information from the filament tip to the first positioning center.

10. The filament positioning system according to claim 9, wherein the detection module identifies positions of the filament tip and the first positioning center through a gray scale of the position image, and computes a distance from an orthographic projection of the filament tip on the upper end surface of the filament seat to the first positioning center.

11. The filament positioning system according to claim 9, wherein the detection module further comprises a pressure sensor; the pressure sensor is fixed to an end surface of the positioning rod facing the filament seat and the internal hexagonal wrenches of the second positioning regulating mechanism, and is connected with the image display module; and the image display module displays a detected pressure value.

12. The filament positioning system according to claim 11, further comprising a driving component; and the driving component is connected with the first positioning regulating mechanism and the second positioning regulating mechanism for driving the first positioning regulating mechanism and/or the second positioning regulating mechanism to perform regulation operation.

13. The filament positioning system according to claim 12, wherein the driving component comprises a first driving component, and wherein the first driving component is connected with the first positioning regulating mechanism for driving the first positioning regulating mechanism to operate so as to regulate a position of the filament seat.

14. The filament positioning system according to claim 13, wherein the driving component further comprises a second driving component, and wherein the second driving component is connected with the second positioning regulating mechanism for driving the second positioning regulating mechanism to operate to regulate the position of the filament tip.

15. The filament positioning system according to claim 13, wherein the first driving component and the second driving component comprise a motor or hydraulic cylinder.

16. The filament positioning system according to claim 13, further comprising a control component, wherein the control component is electrically connected with the detection module and the driving component, and wherein the control component receives the position information transmitted by the detection module, and controls the driving component to drive the first positioning regulating mechanism and/or the second positioning regulating mechanism to operate.

17. The filament positioning system according to claim 16, wherein the control component comprises a controller and a driver,
    wherein the controller is connected with the computer terminal, receives a regulating command and a regulating parameter issued by the computer terminal, and transmits a signal to the driver, and
    wherein the driver is connected with the driving component and the controller; and the driver receives the signal and drives the driving component to move.

18. The filament positioning system according to claim 17, wherein the regulating command comprises a filament regulating command and/or a filament seat regulating command,
    wherein the filament regulating command is used for regulating the position of the filament tip relative to the first positioning center, and
    wherein the filament seat regulating command is used for regulating the position of the filament base relative to the second positioning center and fixing the filament base.

19. A filament positioning method, applied to a filament positioning system comprising a bottom plate, a first positioning regulating mechanism and a second positioning regulating mechanism,
    wherein the bottom plate is provided with a filament seat, configured at a surface of the bottom plate, for fixing a filament and the first positioning regulating mechanism is installed on the bottom plate for regulating a position of the filament seat at the surface of the bottom plate,
    wherein the position of the filament seat relative to the bottom plate is changeable;
    wherein the filament seat has a first positioning center and the second positioning regulating mechanism is configured to regulate the filament, so that a filament tip of the filament is located in the first positioning center,
    wherein a detection module is configured to collect and display position information of the filament tip of the filament and the filament seat,
    wherein the first positioning regulating mechanism and the second positioning regulating mechanism correspondingly regulate positions of the filament seat and the filament according to the position information,
    wherein the method comprises following steps:
        respectively installing the filament seat and the filament on the bottom plate and the filament seat;
        displaying the position information of the filament seat and the filament by the detection module;
        driving the first positioning regulating mechanism to regulate the position of the filament seat according to the position information so that the filament seat is fixed to the bottom plate; and
        driving the second positioning regulating mechanism to regulate the filament according to the position information so that the filament tip is located in the first positioning center
    wherein the bottom plate has a second positioning center and the first positioning regulating mechanism regulates the filament seat so that an axis of the filament seat penetrates through the second positioning center, and
    wherein the first positioning center is located right above the second positioning center.

* * * * *